United States Patent [19]
Calabro

[11] 4,096,547
[45] Jun. 20, 1978

[54] HEAT TRANSFER MOUNTING DEVICE FOR METALLIC PRINTED CIRCUIT BOARDS

[76] Inventor: Anthony D. Calabro, 8738 W. Chester Pike, Upper Darby, Pa. 19082

[21] Appl. No.: 751,272

[22] Filed: Dec. 17, 1976

[51] Int. Cl.$^2$ .................... H02B 1/04; H05K 1/00; H01R 13/20
[52] U.S. Cl. .................... 361/388; 339/17 LM; 339/65
[58] Field of Search ............... 361/386, 387, 388, 389, 361/381, 383, 384, 413, 415; 174/15 R, 16 R; 339/17 LM, 17 M, 17 R, 176 MP, 65, 66 R

[56] References Cited

U.S. PATENT DOCUMENTS

| | | | |
|---|---|---|---|
| 3,631,325 | 12/1971 | Wenz | 361/387 |
| 3,950,057 | 4/1976 | Calabro | 361/415 |
| 3,980,376 | 9/1976 | Rosen | 339/176 MP X |

*Primary Examiner*—J D Miller
*Assistant Examiner*—Peter S. Wong
*Attorney, Agent, or Firm*—Anthony J. Casella

[57] ABSTRACT

A printed circuit board guide and holding device which is particularly adapted for use with metallic printed circuit boards, and which has improved heat transfer capabilities comprises an elongated heat transfer support member which is adapted to receive the printed circuit board engaging means. The heat transfer support member is of generally U-shaped cross section and is made of metallic material, with the upstanding arms including spaced flanges to enable the passage therethrough of the edge of the printed circuit board. One of said flanges includes a depending heat conductive element that is adapted to directly engage and be in intimate contact with the metallic printed circuit board to facilitate the conductive transfer of heat from the board to the support member.

13 Claims, 5 Drawing Figures

HEAT TRANSFER MOUNTING DEVICE FOR METALLIC PRINTED CIRCUIT BOARDS

The present invention relates to the mounting and fastening of modular panels, boards, or cards and in particular cards which are made so as to include a metallic substrate that is coated on its opposed sides with a dielectric material, and then, in turn, the electrical circuit paths, such as lead lines, as well as the electronic elements are mounted thereon. The printed circuit boards and then mounted within a panel rack, cage, or cold frame utilized in connection with electronic equipment or the like.

U.S. Pat. No. 3,231,785 which issued on Jan. 25, 1966 to the inventor of the subject application, and which is entitled "Circuit Board Mounting Device" discloses an integral holding device made of a dielectric material which includes unitary spring fingers for securing conventional printed circuit boards made of a dielectric material, such as plastic, epoxy, etc. Another form of printed circuit card guide and holding device which is particularly adapted for holding large printed circuit boards, usually made of a dielectric material is disclosed in U.S. Pat. No. 3,950,057 which issued on Apr. 13, 1976, also to the inventor of the subject application, and which is entitled "Composite Printed Circuit Card Guide and Holding Device." The patented circuit board mounting device disclosed in the latter patent is particularly adapted for use in conjunction with large size printed circuit boards, on the order of 2 to 3 feet, and more particularly printed circuit boards also made of a dielectric material.

With the advent of more sophisticated and more complicated electronic systems, it has been found that in addition to the important considerations of vibration dampening, and stable mounting, the requirement for increased rigidity of the printed circuit boards has resulted in a tendency to employ printed circuit boards made of a laminated construction, where the substrate of the printed circuit board is metallic. Opposite faces of the metallic substrate are coated with a dielectric material, usually a thin dielectric layer, and in turn the electrical circuitry, including the electronic components, are then mounted to the dielectric facing sheets of the composite printed circuit board. In view of the size of the printed circuit boards, and the number of electronic components mounted thereon, there is a requirement for increasing the heat transfer from the printed circuit board to the surrounding support structure, in the form of the cage or cold frame. As an example, in one particular application, a plurality of printed circuit boards are part of an electronics system aboard a naval vessel. In order to prevent salt water contamination and corrosion of the boards and electric components, the cold frame supporting the boards is encased to form a sealed container. The use of conventional circuit board guides or holders does not efficiently dissipate the heat from the boards to the cold frame, and thus the air within the sealed container becomes hot, thereby possibly affecting the electronics. Of course, as the temperature within the container increases, heat is transferred to the container. However, as is readily apparent, it is more desirable to immediately and directly transfer or disipate the heat from the circuit cards to the container, rather than building up the temperature within the container.

Accordingly, it is an object of the subject invention to provide a new and improved mounting device for metallic printed circuit boards capable of more efficiently effecting the conductive transfer of heat from the printed circuit board to the support structure. It is a further object of the subject invention to provide a new and improved heat transfer mounting device which is capable of accommodating a plurality of metallic printed circuit boards in a manner such that each printed circuit board is in intimate contact with a relatively large mass of support structure for facilitating the dissipation of heat from the metallic printed circuit boards to the surrounding support structure.

These and other features of the present invention will be more fully appreciated when considered in light of the following specification and drawings in which.

Figure 1:
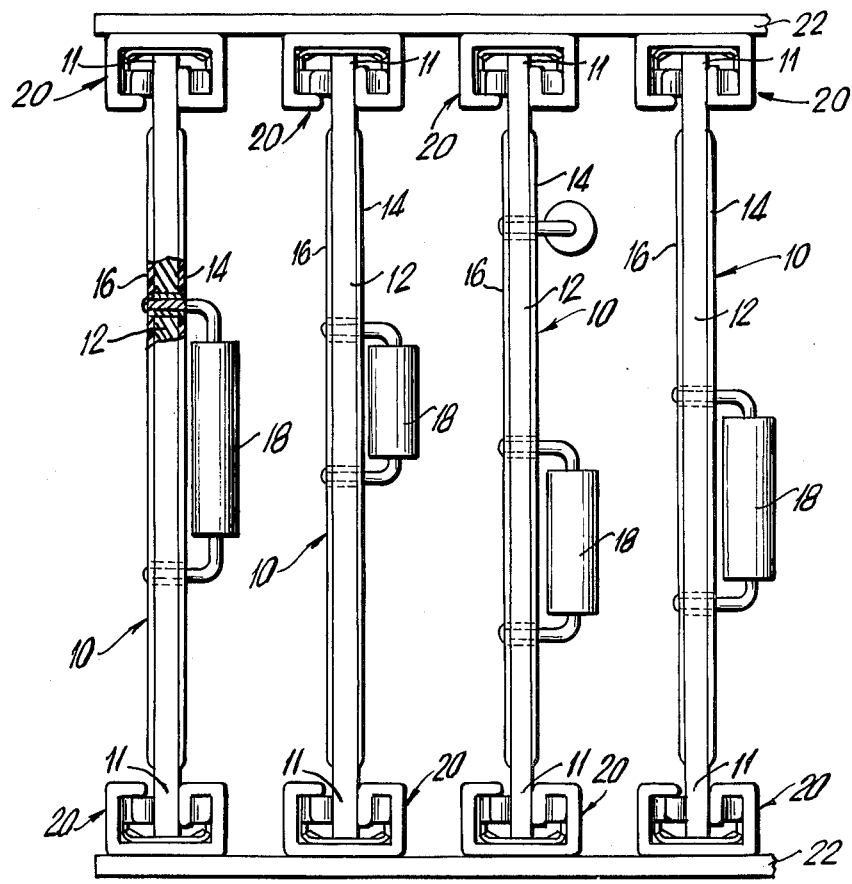
FIG. 1 is a side view of a printed circuit board cage structure wherein a plurality of printed circuit boards are engaged by mounting devices made according to the subject invention.

Referring to FIG 1, a plurality of metallic printed circuit boards, designated by the numeral 10, are held by heat transfer mounting devices 20 which in turn are secured to metallic sheets 22 forming a portion of a rack or cage of standard design. Each metallic printed circuit board 10 basically comprises a metallic substrate 12 to which is laminated on the opposite faces thereof thin plastic film or sheets 14, 16. As in conventional constructions, the printed circuit boards 10 are usually of rectangular configuration, and the opposite edges of the boards 10 are engaged by the heat transfer mounting devices 20. The thin plastic sheets 14, 16 extend over the surface of the metallic substrate to the extent of covering the substrate, except for the opposite edge portions 11 of the metallic substrate which are engaged by the mounting devices 20. Disposed on one or both surfaces of the laminated printed circuit board are lead lines and other electronic circuitry, and also electrical components 18, in conventional fashion. The mounting devices 20 may be secured to the metallic sheets 22 of the cage by suitable means such as rivets, screws or other similar fastening devices. The mounting devices extend along the entire length or edge of the printed circuit board 10, and function to rigidly engage and hold the metallic printed circuit boards 10, even in presence of shock and vibration, and in addition include means so as to function as a heat sink for the conductive dissipation of heat developed in the printed circuit board. As more fully described hereinafter, the opposite edges 11 of the metallic substrate 12 are in intimate contact with the heat conductive element portions of the mounting devices 20, thereby providing a conductive heat path for dissipating the heat generated by the electrical components 18 on the printed circuit board 10.

Figure 2:
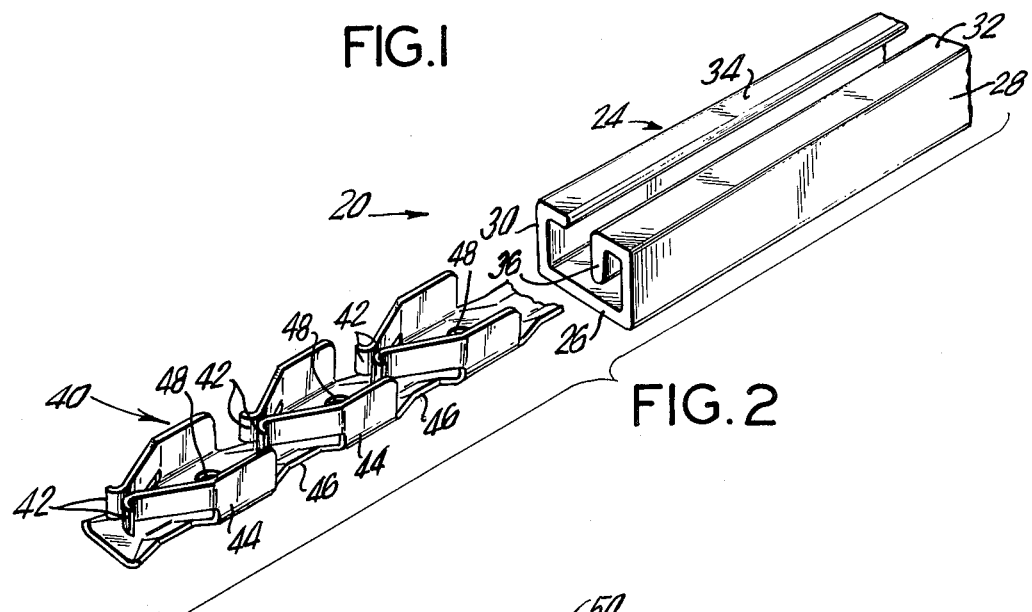
FIG. 2 is an exploded view of a heat transfer mounting device made according to the subject invention.

Turning to FIG 2, each mounting device 20 of the subject invention basically comprises an elongated, generally U-shaped heat transfer support member 24 which is adapted to receive a printed circuit board engaging means, designated by the numeral 40. The support member 24 is of general U-shaped cross section including a base 26 and upstanding arms 28, 30. Extending from the distal ends of the upstanding arms 28, 30 are inwardly directed flanges 32, 34 which are spaced a sufficient distance to enable the passage therethrough of the edges 11 of the printed circuit boards 10. The support member 24 is preferably made of a heat conductive material, such as aluminum which may be readily extruded to the desired configuration. Depending from one of the inwardly directed flanges, is a heat conductive element 36 which extends generally parallel to the upstanding arms 28, 30 and in a direction toward the base 26. The height of the heat conductive element 36 is preferably on the order of ⅔ of the upstanding height of the arms 28, 30. Preferably the heat transfer support member 24 is made of an extruded aluminum material, of unitary construction. The thickness of the portions of the support member 24 is preferably uniform, and is of sufficient mass to ensure the efficient conductive transfer of heat from the metallic substrate 12.

The printed circuit board engaging means 40 is likewise of generally U-shaped configuration, and is preferably formed of a spring temper beryllium copper, phosphor bronze or stainless steel. Means 40 is preferably stamped and formed from a relatively thin sheet of metallic material, with the thickness of the metallic sheet being less than the thickness of the heat conductive element 36 and the other portions of the heat transfer support member 24. The printed circuit guide engaging means 40 is formed so as to define opposed cantilevered spring fingers 42. Intermediate the supporting walls 44 for the spring fingers 42, the metal strip forming the printed circuit guide engaging means is indented as at 46 in order to add additional longitudinal rigidity to the means 40. The vertical height of each spring finger 42 is less than the total height of the upstanding supporting wall 44 in order to provide additional material for formation of the indentation 46. Apertures 48 may be provided in the base of the engaging means 40.

The printed circuit board engaging means 40 is slidably received within the confines of the heat support member 24. As illustrated in FIG. 1, one of each pair of opposed spring fingers 42 is disposed within the inverted U-shaped channel formed by the heat conductive element 36 and the upstanding arm 28, while the opposite spring finger 42 is directly against the edge 11 of the metallic printed circuit board 10 in order to bias the metallic edge 11 in intimate contact against the heat conductive element 36. By this arrangement, in addition to holding and dampening shock and vibrations applied to the printed circuit board 10, the intimate engagement of the metallic edge 11 of the board against the heat conductive element 36 provides a thermal path for the dissipation of heat generated in the metallic printed circuit board through the conductive element 36, and then through the heat conductive support member 24 to the metallic sheets 22 of the cage. The fact that the spring finger 42 engaging the opposite side of edge 11 of the metallic substrate 12 is of less mass than the mass of the conductive element 36 is important in establishing the thermal path through the conductive element 36. Another important factor is the fact that the spring fingers 42 only engage the elongated edge 11 of the printed circuit board 10 at spaced intervals, whereas the heat conductive element 36 is in intimate contact substantially along the entire elongated edge of the edge 11 of the metallic printed circuit board 10. This is of extreme importance in view of the well known law of physics relative to the characteristics of heat conduction to wit, the amount of heat conducted per second is *directly proportional to the area* through which it can flow. Still further, as illustrated in FIG. 1, the vertical height of the heat conductive element 36 is greater than the portions of the spring fingers in intimate contact with the edge 11.

Figure 3:
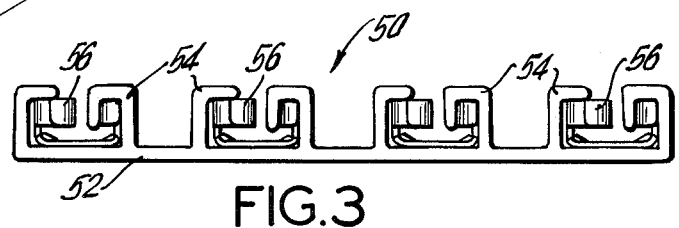
FIG. 3 is an end view of a alternate embodiment of a heat transfer mounting device made according to the subject invention.

FIG. 3 illustrates an alternate embodiment of the subject thermal mounting device wherein a single extrusion forms a plurality of heat transfer support members. The multiple mounting device is designated by numeral 50 and comprises a unitary extrusion, preferable of aluminum, having a common planar base 52. A plurality of heat transfer support members 54 are defined by device 50 and are of similar construction to support members 24. Each support member 54 accommodates a printed circuit board engaging means 56 similar in construction to means 40. Mounting device 50 may be readily attached or secured to a chasis, and accommodates a plurality of printed circuit boards, and functions in the same manner as individual devices 20 in holding and dampening shock and vibrations applied to the printed circuit boards, and at the same time aiding in the dissipation of heat. Alternatively, mounting device 50 may be formed by rigidly securing a plurality of devices 20 to a single sheet forming a common base. Devices 20 may be secured by welding, rivetting, bonding, or by suitable fasteners.

Figure 4:
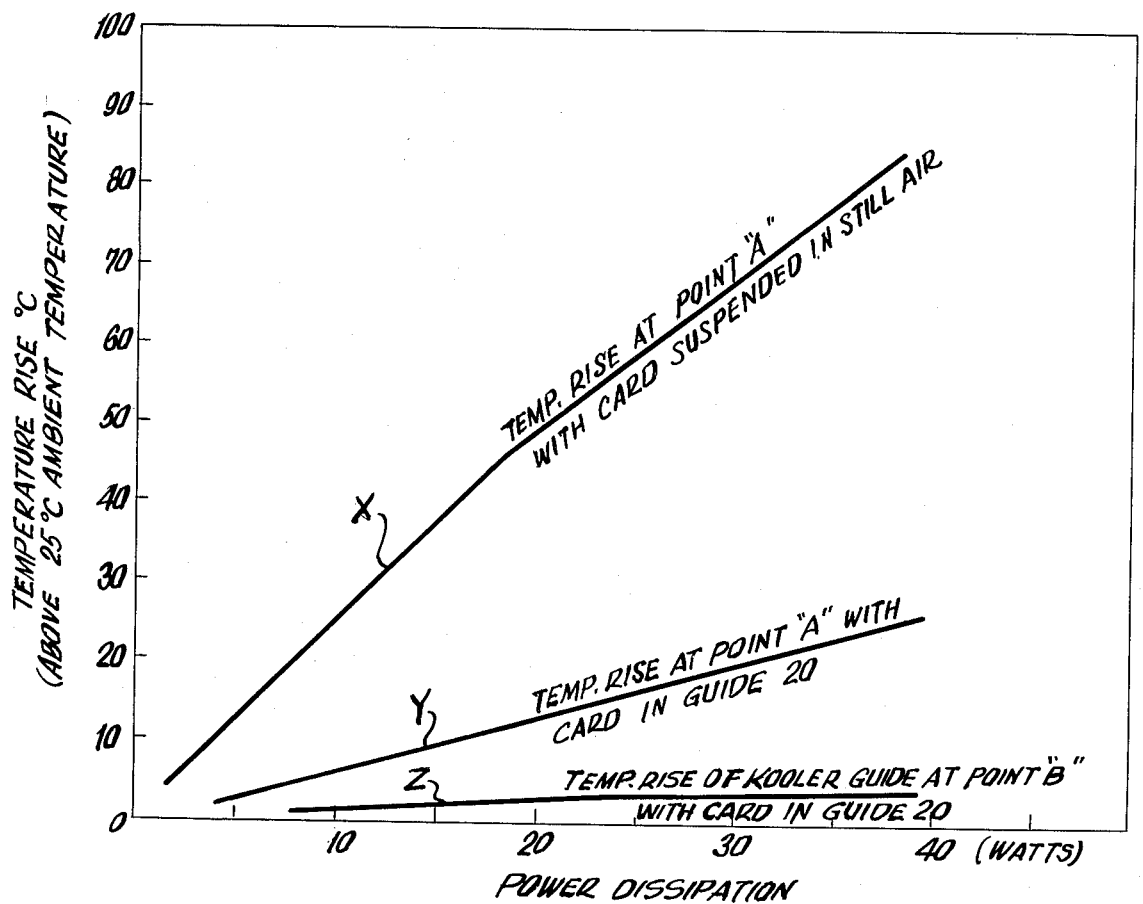
FIGS. 4 and 4A are a graph showing the effectiveness of the subject heat transfer mounting device, and the test set-up for the results plotted in FIG. 4, respectively.
Figure 4A:
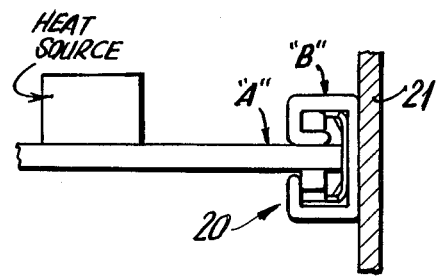

FIG. 4 dramatically illustrates the effectiveness of the heat transfer mounting device 20 made according to the subject invention, in an actual test conducted by the applicant. In the graph of FIG. 4, the temperature rise in degrees centrigrade above the ambient temperature (25° C) is plotted against the power dissipated in units of watts. As shown in FIG. 4A, the test set-up included an arrangement wherein a heat source was placed on an aluminum card, the ends of which were engaged by heat transfer mounting devices 20, made according to the subject invention. The device 20 was, in turn, mounted to a cold frame, designated by the numeral 21. Temperature measurements were made at points A and B designated in FIG. 4A, with the card mounted within the device 20, and with the card merely suspended in still air. The results of the test are plotted in the form of three curves shown in FIG. 4, with curve X being the test wherein the card was suspended in still air, and the temperature rise at point "A" was plotted as a function of the power dissipation. As noted in FIG. 4, as the power dissipation increases from 0 to 40 watts, the temperature rise above ambient at point A on the card increased from 0° to approximately 90° C.

Curve Y indicates the test results when the card was mounted within the mounting device 20, and the temperature rise at points "A" was recorded. As noted, when the power dissipation is increased from 0 to 40 watts, the temperature rise is merely increased from 0° to approximately 28° C. The final graph Z indicates the temperature rise of the mounting device 20 as recorded at point "B, " with the car being mounted within the guide 20. As is readily apparent, from a mere comparison of the curves X and Y, at a power dissipation of 40 watts, the increase in efficiency in the thermal dissipation of heat generated within the card is on the order of approximately 300%.

Accordingly, there is provided a new and improved heat transfer mounting device, which is operative to provide a direct conductive heat path for dissipating the heat generated by electrical components on a printed circuit card. Although the invention has been described with respect to a metallic printed circuit board, it is readily apparent that the subject heat transfer mounting device may also be employed in conjunction with standard printing circuit boards made of a dielectric material, or other forms of printed circuit boards, such as boards having a dielectric substrate, and including metallic sheet boarders or bus bars. As is readily apparent numerous modifications and changes may readily occur to those skilled in the art, and hence it is not desired to limit the invention to the exact construction and operation shown and described, and accordingly all suitable modifications and equivalents may be resorted to, falling within the scope of the invention as claimed.

What is claimed is:

1. A mounting device for printed circuit boards having improved heat transfer capabilities comprising:
  an elongated generally U-shaped heat transfer support member made of a metallic material and being of generally uniform thickness, said support member including a base and two upstanding arm portions, each of said arm portions including an inwardly directed flange disposed generally parallel to said base, said flanges being spaced a sufficient distance to enable the passage therethrough of the edge of the printed circuit board, and with one of said flanges having a heat conductive element extending therefrom for directly engaging the printed circuit board to facilitate the conductive transfer of heat from said printed circuit board; and
  printed circuit board engaging means wholly disposed in said U-shaped heat transfer support member for resiliently engaging and holding said printed circuit board.

2. A mounting device for printed circuit boards as in claim 1 wherein said heat conductive element depends from said one flange and extends generally parallel to said upstanding arm portions, and is disposed between said one flange and said base.

3. A mounting device for printed circuit boards as in claim 2 wherein said heat conductive element extends for a distance of approximately ⅔ the height of said upstanding arm portion.

4. A mounting device for printed circuit boards as in claim 1 wherein said heat transfer support member is made of an extruded aluminum, and wherein said printed circuit board engaging means is metallic.

5. A mounting device for printed circuit boards as in claim 1 wherein the mass of the heat conductive element which is in contact with the printed circuit board is substantially greater than the mass of said engaging means which engages said printed circuit board.

6. A mounting device for printed circuit boards as in claim 1 wherein said heat transfer support member is of unitary construction.

7. A device for holding and guiding a plurality of metallic printed circuit boards and having improved heat transfer capabilities comprising an integral member including a corresponding plurality of mounting portions, each of which includes an elongated generally U-shaped heat transfer support member made of a metallic material and including a base and two upstanding arm portions, each said arm including an inwardly directed flange disposed generally parallel to said base, said flanges being uniformly spaced a sufficient distance to enable the passage therethrough of the edge of the respective printed circuit board, and with one of said flanges having a heat conductive element depending therefrom for directly engaging the respective printed circuit board to facilitate the conductive transfer of heat from said board; and printed circuit card engaging means, wholly disposed in each said U-shaped member for resiliently engaging and holding said printed circuit board.

8. A device for holding and guiding a plurality of printed circuit boards as in claim 7 wherein the bases of the mounting members are disposed in a single plane.

9. A device for holding and guiding a plurality of printed circuit boards as in claim 7 wherein the mass of each heat conductive element is greater than the portion of each said engaging means which engages said printed circuit board.

10. A device for holding and guiding a plurality of printed circuit boards as in claim 7 wherein said integral member is made of extruded aluminum.

11. A device for holding and guiding a plurality of printed circuit boards as in claim 7 wherein said integral member is unitary.

12. A device for holding and guiding a plurality of printed circuit boards as in claim 7 wherein each said heat conductive element depends from said one flange and extends generally parallel to said upstanding arm portions, and is disposed between said one flange and said base.

13. A device for holding and guiding a plurality of printed circuit boards as in claim 12 wherein said heat conductive element extends for a distance of approximately ⅔ the height of said upstanding arm portion.

* * * * *